United States Patent [19]

Hwang et al.

[11] 4,443,930
[45] Apr. 24, 1984

[54] MANUFACTURING METHOD OF SILICIDE GATES AND INTERCONNECTS FOR INTEGRATED CIRCUITS

[75] Inventors: Thomas J. Hwang; Steven H. Rogers; Mary E. B. Coe, all of Colorado Springs, Colo.

[73] Assignee: NCR Corporation, Dayton, Ohio

[21] Appl. No.: 445,392

[22] Filed: Nov. 30, 1982

[51] Int. Cl.$^3$ .......................................... H01L 21/283
[52] U.S. Cl. ........................................ 29/571; 29/591; 204/192 C; 204/192 SP; 357/67; 427/93
[58] Field of Search ................................. 29/589-591, 29/571; 204/192 C, 192 SP, 192 S; 357/67 S, 71; 427/84, 88, 91, 93

[56] References Cited

U.S. PATENT DOCUMENTS 4,180,596 12/1979 Crowder et al. ...................... 427/42
4,285,761 8/1981 Fatula et al. ......................... 156/628
4,337,476 6/1982 Fraser et al. ..................... 428/472 X

OTHER PUBLICATIONS

Crowder et al., "1 μm MOSFET VLSI Technology: Part VII-Metal Silicide Interconnection Technology-A Future Perspective", IEEE Transactions on Electron Devices, vol. ED-26, No. 4, Apr. 1979, pp. 369-371.
Mochizuki et al., "Film Properties of MoSi$_2$ and their Application to Self-Aligned MoSi$_2$ Gate MOSFET", IEEE Transactions on Electron Devices, vol. ED-27, No. 8, Aug. 1980, pp. 1431-1435.
Tsai et al., "One-Micron Polycide (WSi$_2$ on Poly-Si) MOSFET Technology", J. Electrochem. Soc.: Solid-State Science and Technology, vol. 128, No. 10, Oct. 1981, pp. 2207-2214.
Murarka, S. P., "Refractory Silicides for Low Resistivity Gates and Interconnects", IEEE International Electron Devices Meeting 1979, pp. 455-457.
S. P. Murarka, "Silicides: Which, Why and How", J. Electrochemical Society, vol. 81-1, pp. 551-561, 1981.
Murarka et al., "Refractory Silicides of Titanium and Tantalum for Low-Resistivity Gates and Interconnects", IEEE Transactions on Electron Devices, vol. ED-27, No. 8, Aug. 1980, pp. 1409-1417.

Primary Examiner—Brian E. Hearn
Assistant Examiner—Alan E. Schiavelli
Attorney, Agent, or Firm—J. T. Cavender; Casimer K. Salys

[57] ABSTRACT

A method of forming on a substrate a layer of silicon-rich metal silicide such as tungsten silicide, WSi$_x$ where x>2 by cosputtering a tungsten disilicide (WSi$_2$) target and a doped silicon target on to the substrate which is maintained at room temperature. When the silicon-rich silicide is deposited on a doped polysilicon layer the resulting silicon-rich metal silicide/polysilicon sandwich layer has a low resistivity and is suitable for forming therefrom gates and interconnecting conductors for integrated circuit devices.

16 Claims, 5 Drawing Figures

MANUFACTURING METHOD OF SILICIDE GATES AND INTERCONNECTS FOR INTEGRATED CIRCUITS

This invention relates to a process of forming silicide gates and conductive lines for semiconductor devices and, more particularly, to a process of forming silicon-rich silicide gates and conductive lines that is suitable for a high-volume integrated circuit semiconductor device manufacturing line.

BACKGROUND OF THE INVENTION

Polycrystalline silicon (polysilicon) gates and interconnecting conductor lines for MOS and MNOS integrated circuits have, for more than a decade, replaced the more conventional metal gates and allowed for an additional set of conductive lines. Polysilicon has been found to be a particularly attractive material since it is very stable at the high temperatures necessary for introducing impurities in source and drain regions of semiconductor devices, can be oxidized to form a silicon dioxide thereon and is suitable for etching fine lines.

One disadvantage of polysilicon is its relatively high electrical resistance of the order of (20-30) ohms per square for a typical film of about 5000 Angstroms thickness. This high electrical resistance introduces RC time delays, particularly when the polysilicon lines are long. For example, at the device level, a 1 micron wide, 100 micron long line would have an RC time constant of about 0.1 ns. Correspondingly, rise-time would be 0.2 ns which is small compared to a 1 micron gate width device's intrinsic delay of 0.5 ns (fan-out of 2). But as polysilicon lines get longer—as in the word lines of large static or dynamic RAMs—the RC time delay can become the dominant speed limitation. Since this delay is proportional to the square of line length (both R and C vary linearly), the resistance of a 1000 micron line would cause a time delay of nearly 20 ns, which is significantly greater than device delays.

The above RC time delays in polysilicon are intolerable in present-day integrated circuits, particularly the very large scale integrated (VLSI) circuits, where high speed is an important requirement.

A number of alternatives to conventional polysilicon gates and interconnects exist. One alternative is the two-layer metal approach which substitutes metal for polysilicon in long lines where RC delay is likely to be a problem. An alternative to this first approach, is running a metal line parallel to a polysilicon line and strapping the two lines together at every few hundred microns or so. But this 2-layer metal approach is rather difficult to implement, not only from a device standpoint, especially in the case of VLSI's submicron layouts, but also from a process standpoint because the metals need to be isolated from each other.

A second alternative is to replace the polysilicon with a refractory metal silicide such as molybdenum silicide, tungsten silicide, tantalum silicide, titanium silicide and mixtures thereof. The silicides have processing properties similar to polysilicon with the added advantage of an order-of-magnitude lower sheet resistance. However, the silicide-gate designs have stability problems. If a silicide material is placed directly over the gate oxide, high temperature processing can cause the metal to diffuse through the gate and degrade the device performance via the gate oxide breakdown. Other problems with this approach include a high silicide to n+-contact (or buried contact) resistance and the inability of the silicide to self-oxidize.

A third alternative that potentially avoids the metal diffusion problem is the use of a gate sandwich structure consisting of polysilicon on the bottom and a metal silicide on the top with only the polysilicon contacting the gate oxide. This polysilicon-silicide structure is commonly called a polycide. This approach offers the advantage of lower sheet resistance on the order of (1-5) ohms per square and is attractive from a process standpoint since it is more easily inserted into an existing process line. Because of these advantageous features, this approach has been gaining wide-spread popularity.

A number of polycide structures have been reported in the prior art. These include silicides of almost all the transition metals, chromium, nickel and iron formed on polysilicon. Of these, a tungsten polycide structure consisting of tungsten disilicide ($WSi_2$) on top of a doped polysilicon layer has been the subject of intensive investigation not only because of its low resistivity but also because of its stable chemical processing properties and compatibility as a gate material (i.e. MOS devices fabricated with $WSi_2$/polysilicon gate material exhibit excellent silicon dioxide-silicon interface properties such as low surface state density, $Q_{ss}$, and low surface state density distribution) while preserving the proven polysilicon gate advantages.

Methods of forming silicide, in particular tungsten silicide, on polysilicon are known to the prior art. For example, in U.S. Pat. No. 4,180,596 entitled "Method For Providing A Metal Silicide Layer On A Substrate" and issued on Dec. 25, 1979, to Crowder et al., is disclosed a method of forming a metal silicide such as molybdenum silicide, tantalum silicide, rhodium silicide and tungsten silicide on a substrate such as doped silicon or polysilicon. The silicide is formed by co-evaporation of silicon and the metal. Due to differences in evaporation rates of silicon and the metal, Crowder et al. employs a separate electron beam gun for evaporating these materials. The metal silicide films formed in this manner contain (25-60) atomic percent of the metal and (75-40) atomic percent of silicon.

However, the dual electron-beam co-evaporation technique of Crowder et al. suffers from a number of disadvantages. In particular, this process requires accurate and careful control (by means of a microprocessor controlled feedback circuit coupled to the evaporator) of each electron beam that impinges on the material and causes evaporation thereof to obtain stoichiometric $WSi_2$. Another disadvantage of this prior art process is that the silicon material is rather difficult to evaporate using an electron beam since it requires a very high temperature to undergo the required phase change and the high temperature, in turn, causes large thermal gradients in the evaporator hearth, thereby producing "spitting" of the silicon. Consequently, the composition of the resulting tungsten silicide is uncertain.

Reference is now made to U.S. Pat. No. 4,285,761 entitled "Process For Selectively Forming Refractory Metal Silicide Layers On Semiconductor Devices" and issued Aug. 25, 1981 to Fatula et al. The Fatula et al. patent while teaching, like the Crowder et al. patent, a method of co-evaporation of a metal and silicon by heating the respective targets of metal and silicon with electron beams, suggests alternate techniques of evaporating a metal silicide on polysilicon. These suggested techniques are RF sputtering the metal silicide from a single target containing the right proportion of silicon and metal and also sputtering from two targets of the elemental metal and the elemental silicon. Forming the metal silicide by sputtering from a single target as suggested by Fatula et al. has two major drawbacks. Due to interaction between the target's constituents (i.e. the metal and the silicon) during sputtering the silicide film formed will not have the desired composition. Another problem is that the resulting silicide will receive large tensile stresses in the range $(1-3) \times 10^{10}$ dynes per square cm. due to volume shrinkage associated with their formation. As a result, the film will not be stable. Also, the silicide film suffers from cracking and peeling during subsequent process steps such as annealing and etching. Another problem is that a polycide gate formed by this process will have significant step coverage and reliability problems due to severe undercutting of the polysilicon during etching of the polycide layer to form the gate. Co-sputtering from two different targets of metal and silicon as suggested by Fatula et al., on the other hand, requires microprocessor-controlled power supplies for the individual targets to control the sputter rate from each target to provide the proper silicide composition. This necessitates an extensive and expensive modification of the sputtering system.

What is needed is a simple, inexpensive and dependable technique of forming metal silicides.

Accordingly, it is an object of the present invention to provide a process, which is particularly suited for a large volume manufacturing environment, of forming metal silicides by using an off-the-shelf sputter deposition system without the necessity for any modification thereof.

It is another object of this invention to provide a process of forming a metal silicide film on a polysilicon film that adheres excellently to the polysilicon enabling excellent electrical contact between the two films.

It is another object of this invention to provide a process which guarantees consistently silicon-rich metal silicide films.

It is yet another object of this invention to provide a process for forming a metal silicide film of high integrity suitable for gates and interconnecting conductor lines.

These and other objects of this invention will be apparent from the following description.

SUMMARY OF THE INVENTION

The subject invention comprises an improved processing technique which eliminates the above-mentioned problems by co-sputtering from two independent targets of silicon and metal silicide. The sputtered deposition may be accomplished in any commercially available dual-target sputtering-gun deposition system by subjecting the two targets to the same sputtering conditions. In one example, the metal silicide target is tungsten disilicide and the silicon target is a doped silicon. The resulting film is silicon-rich tungsten silicide having the composition $WSi_x$ where x is greater than 2. Hereafter $WSi_x$ designates $WSi_x(x>2)$.

One application of the above processing technique is forming $WSi_x$/polysilicon gates and interconnecting conductor lines for an integrated circuit device such as an NMOS device. In this process, after defining the device active area on a semiconductor substrate by means of a conventional semi-recessed oxide isolation scheme, a thin gate oxide is grown. After the usual threshold implants, a relatively thick polysilicon layer is deposited on the wafer and then doped. Thereafter, a silicon-rich tungsten silicide is sputter-deposited on the wafer, at room temperature, by co-sputtering tungsten disilicide and silicon targets. After forming the $WSi_x$/polysilicon sandwich in this manner, it is patterned into gates and interconnecting conductors by plasma etching. Thereafter, the device sources and drains are formed by arsenic or phosphorus implantation such that they are self-aligned with the gate, followed by a simultaneous high temperature annealing (of about 1000° C.) in a nitrogen atmosphere of source and drains and $WSi_x$ gates and conductors. Then, metallization is done after isolating the various $WSi_x$/polysilicon structures by means of a CVD oxide.

DETAILED DESCRIPTION OF THE INVENTION

The process of the present invention is applicable to forming films of the desired silicon-rich metal silicide on any substrate. The metal silicide which can be formed by using the present invention includes tungsten silicide, molybdenum silicide, titanium silicide and tantalum silicide. The silicon to metal content in the metal silicide is consistently greater than 2.

The present process is particularly advantageous for fabricating integrated circuit's gates and interconnecting conductors when the silicon-rich silicide is formed on polysilicon and the sandwich structure of silicon-rich silicide/polysilicon is patterned into gate electrodes and conductors.

According to the present invention, a silicon-rich metal silicide is formed by co-sputtering targets of a metal disilicide and silicon and simultaneously depositing the resulting sputterants on the substrate. The sputtered deposition may be accomplished by utilizing any one of the standard, commercially available high production volume sputter deposition systems. The description of the present invention will be provided with specific reference to silicon-rich tungsten silicide fabrication.

SPUTTER DEPOSITION PROCEDURE

One commercially available deposition system that is suitable to practice the present invention is Varian Model 3120 Coater System. This is a DC magnetron sputtering deposition system having a large deposition chamber which is equipped with three approximately 50 cm. diameter planetary rotating wafer holders and a cryogenic/diffusion pump. The wafer holders can each accommodate up to fifteen 4-inch wafers. The system is also equipped with a master programmer which is a completely automatic solid state sequencer that is capable of cycling from atmospheric pressure, to high vacuum pressure, through a complete sputter deposition cycle, and back to atmospheric pressure with no operator intervention.

The tungsten disilicide and silicon targets used in conjunction with the above coater system were of the same size, of approximately 13 cm in diameter. The silicon target was doped with an n-type dopant such as antimony or phosphorus or a p-type dopant such as boron in order to make it electrically conductive which is a requirement of the DC magnetron sputtering technique. The doping level of the silicon target is close to the saturation level of about $10^{21}$ ions/sq. cm. The purity of the tungsten disilicide target was better than 99.5% and that of the silicon target was 99.999%. These targets were supplied by Varian Specialty Metals, Grove City, Ohio.

In one example of the present invention, wafers coated with a desired thickness (typically 1500–3000 Angstroms thickness) of polysilicon were mounted on the wafer holders for depositing a silicon-rich tungsten silicide thereon. The deposition chamber base pressure was first reduced, typically, to less than about $5 \times 10^{-7}$ torr. The pressure was then increased by about 4 orders of magnitude to about (3–4) millitorr in the "throttled" mode by admitting pure argon gas into the chamber. This pressure was maintained during the $WSi_x$ sputtering.

The wafer holders rotated throughout the deposition cycle at a constant rate of about 15 revolutions per minute providing a uniform coating of the silicon-rich silicide film on the wafer. A power of (0.3–1.5) kilowatts was supplied to each of the targets to accomplish sputtering thereof. At higher than 1.5 kilowatts of power, the targets were susceptible to cracking. At lower than 0.3 kilowatts, the sputter rate was rather slow, which not only reduced the throughput of the coated wafers but also, due to the consequent long sputter deposition times, introduced additional impurities such as oxygen and hydrocarbons present in the deposition system into the $WSi_x$ coating. For the above range of target power, the rate of $WSi_x$ deposition was in the range of (0.5–3) Angstroms per second. In particular, when a power of 0.7 kilowatts and 0.5 kilowatts were supplied to the $WSi_2$ and Si targets, respectively, the resulting $WSi_x$ deposition rate was approximately 1 Angstrom per second.

During the entire sputter deposition cycle, the wafers were maintained at near room temperature.

After the desired thickness of $WSi_x$ film was deposited on the polysilicon-coated wafers, the wafers were removed from the deposition chamber and were patterned using a conventional plasma etch into gates and/or interconnects followed by other processing steps in accordance with the particular intended use of the $WSi_x$/polysilicon sandwich layer. Note, no annealing of $WSi_x$/polysilicon was necessary prior to etching. Annealing, in a dry nitrogen ambient at a temperature of about (800–1000)° C. for about 30–40 minutes, may be accomplished in conjunction with other processing steps such as source and drain anneal to lower the sheet resistance of $WSi_x$/polysilicon gates and/or interconnects.

By using the above process, $WSi_x$ films of a wide thickness range of (1500–4000) Angstrom may be deposited. The desired thickness of $WSi_x$ is determined by the required sheet resistance. For example, a 2500 Angstroms thick layer of $WSi_x$, after annealing at a temperature of about 1000° C. in a dry nitrogen ambient for about 30 minutes will have a sheet resistance of approximately 3 ohms per square.

CHARACTERIZATION OF THE $WSi_x$ FILM

Since a stoichiometric $WSi_2$ target and a separate Si target were cosputtered, the tungsten silicide film formed by using this process was consistently silicon-rich. The silicon to tungsten atomic ratio in the resulting film was in the range of 2–3.

ETCHING CHARACTERISTICS OF $WSi_x$/POLYSILICON

A decisive factor in determining the success of the silicide on polysilicon approach is the ability to etch fine lines in this sandwich layer, necessary for VLSI circuits, with good line-width control. As discussed hereinabove, in a conventionally formed silicide (e.g. $WSi_2$, $MoSi_2$)/polysilicon sandwich, the silicide typically etches at a slower rate than polysilicon regardless of the type of etching (i.e. dry or wet etching) and in the case of dry (plasma) etching regardless of the plasma etchant gas used. The silicide to polysilicon etch ratio, also known as the silicide-to-polysilicon etch selectivity, that can typically be attained for this sandwich is in the range of 0.7–0.9 which is less than the desirable range of about 1.1–1.4. As a result of this poor etch selectivity, the conventionally formed silicide/polysilicon sandwich layers typically have a silicide overhang after etching, thereby introducing serious step-coverage and reliability problems.

To study the etching characteristics of the $WSi_x$/polysilicon sandwich formed in accordance with the present process, samples of a 2500 Angstrom thickness $WSi_x$ film formed on an equivalent thickness of n-doped polysilicon layer were utilized. After forming the $WSi_x$/polysilicon sandwich on the wafer in the manner described hereinabove, the wafer was subjected to a dehydration bake at a temperature of about 300° C. to remove any water vapor that might have condensed on the $WSi_x$ film after the wafer was removed from the sputter deposition system. Thereafter, a photoresist layer was formed on the $WSi_x$ film and a desired fine line pattern was defined on the film. Next, the sandwich layer was etched in a conventional planar plasma etch reactor system such as the Drytek DRIE-100 to form the fine line patterns. In one example, the plasma etchant gas used was a mixture of carbon tetrafluorine ($CF_4$) and oxygen ($O_2$). The flow rates of $CF_4$ and $O_2$ were 360 sccm and 40 sccm, respectively. The reactor pressure was of the order of 200 microns and the power utilized for etching was approximately 700 watts. The basic etch reaction involved is $$7CF_4 + 2\ WSi_x \rightarrow 2WF_6 + (2 \times Si)\ 4F_4 + 7C$$

$O_2$ is added to $CF_4$ to prevent the accumulation of nonvolatile carbon on the surface being etched and on the reactor walls. Note, from the above etch reaction it is clear that more silicon than tungsten is etched with a given amount of fluorine. For the above etch parameters, the time that was necessary to etch the samples was, typically, about 3 minutes.

The $WSi_x$ film formed in accordance with the present invention and etched in the manner described above displayed an etch rate which is higher than that of polysilicon. Specifically, the etch selectivity of $WSi_x$-to-polysilicon for the conditions specified was about 1.2 which is within the desirable range mentioned hereinabove of 1.1–1.4. This improved etch selectively of $WSi_x$-to-polysilicon is due to the high silicon-to-tungsten atomic content (of the order of 2–3) in the $WSi_x$ film and the fact that the fluorine atoms in the etchant gas etch silicon faster than tungsten.

A direct benefit of the above high etch selectivity of $WSi_x$-to-polysilicon is that the etch profile obtained of the $WSi_x$/polysilicon sandwich is one of near-vertical walls. As a result of this improved profile, it is possible to obtain very accurate and easy control of channel length and conductor line width, obtain excellent step coverage, eliminate silicide overhang problems and, in general, achieve better reliability of a device formed using $WSi_x$/polysilicon gates/interconnects.

ANNEAL CHARACTERISTICS OF $WSi_x$/POLYSILICON

As-deposited prior art tungsten silicide is an amorphous and non-homogeneous mixture of tungsten and silicon and, as a result, immediately after deposition, annealing is essential for homogenizing the silicide. Annealing is also necessary to cause crystallization of the tungsten silicide, provide the stabilizing characteristics of the film and reduce the sheet resistance. The $WSi_x$ formed in accordance with the present invention is a homogeneous mixture of $WSi_x$ and Si, but, nevertheless, requires post-deposition annealing for reducing its sheet resistance, etc.

The etching characteristics of the prior art $WSi_2$/polysilicon and the present $WSi_x$/polysilicon structures are quite different depending upon whether or not these structures are subjected to an annealing treatment.

When a $WSi_2$/polysilicon structure is annealed, typically in an inert atmosphere at a temperature of about 1000° C. for about (20–60) minutes, the dopant, such as phosphorus, present in the doped polysilicon layer apparently migrates to the $WSi_2$-polysilicon interface, but, due to the near-stoichiometric composition of $WSi_2$, not into the $WSi_2$ bulk. Consequently, when this $WSi_2$/polysilicon structure is etched, the $WSi_2$ will have a near-vertical etch-profile and the polysilicon will be severely undercut causing a significant $WSi_2$ overhang. Such an overhang is undesirable due to step coverage and reliability problems during subsequent stages of fabrication process.

On the other hand, if the $WSi_2$/polysilicon structure is not subjected to an annealing step, the $WSi_2$-to-polysilicon etch selectivity will be low in the range of 0.8–0.9 which will again result in an undesirable $WSi_2$ overhang.

In contrast with the above, if the $WSi_x$/polysilicon sandwich is subjected to an annealing treatment, due to the non-stoichiometric composition of $WSi_x$, dopant from the underlying polysilicon will readily diffuse into the $WSi_x$ bulk. Consequently, when this sandwich is subjected to an etching step, the $WSi_x$ will develop an etch profile having a negative slope and the polysilicon will develop a profile having a positive slope. Additionally, the $WSi_x$ may have a slight overhang. Thus the etch profile of annealed $WSi_x$/polysilicon is different from that of annealed $WSi_2$/polysilicon, but, nevertheless, is not desirable due to reliability and step coverage problems arising from such a profile.

Unannealed $WSi_x$/polysilicon sandwich, in contrast with its counterpart-unannealed $WSi_x$/polysilicon—has a $WSi_x$-to-polysilicon etch selectivity in the desirable range of 1.1–1.4 and etches with a near-vertical wall profile.

This suggests that to obtain optimum results with the present process, the $WSi_x$/polysilicon sandwich should be etched (to form the desired pattern) prior to the annealing step.

ADHESION CHARACTERISTICS OF THE $WSi_x$ FILM

Prior-art $WSi_2$ films generally have poor adhesion to polysilicon. Annealing these films, particularly at a high temperature of about 1000° C. in an inert atmosphere for about an hour, makes this adhesion worse.

In contrast, the silicon-rich tungsten silicide film formed in accordance with this process has excellent adhesion to polysilicon and silicon dioxide. This improved adhesion of $WSi_x$ to polysilicon, for example, insures excellent electrical contact between these two films thereby making the $WSi_x$/polysilicon sandwich particularly suitable for forming therefrom gates and interconnecting conductors. In further contrast with conventional $WSi_2$ films, the silicon-rich tungsten silicide film formed by the present process has excellent adhesion to polysilicon even after a high temperature annealing treatment.

In order to understand these improved adhesion characteristics of $WSi_x$ to polysilicon, samples of $WSi_x$/polysilicon dual layer, each individual layer consisting of the dual layer having a thickness of 2500 Angstroms were analyzed. The samples were grouped into two groups: the as-sputtered or unannealed samples and those thermally annealed at a temperature of about 1000° C. in a nitrogen ambient for a time of about (30–40) minutes. The analysis of these samples consisted of obtaining their Auger electron spectra, Rutherford backscattering spectra and X-ray diffraction patterns. The Auger analysis provided the depth profiles of silicon and tungsten atomic distribution. The Rutherford backscattering study provided the atomic ratio of silicon-to-tungsten in the $WSi_x$/polysilicon sandwich layer. The X-ray diffraction patterns provided the crystal structure of the samples. In other words, the above studies were complementary with each other.

The results of the above experiments were consistent with each other and demonstrated that the as-deposited $WSi_x$ film formed in accordance with the present invention was amorphous and silicon-rich having a silicon/tungsten atomic ratio of approximately 3. The annealed samples, in contrast, underwent a structural change. The $WSi_x$/polysilicon dual layer, upon annealing, transformed into a stoichiometric $WSi_2$/transition layer/polysilicon structure. This structural change is attributed to a redistribution of silicon and tungsten atoms during annealing. The stoichiometric $WSi_2$ layer was of a uniform thickness of approximately 2000 Angstroms. The transition layer was of approximately 1000 Angstroms thickness and the polysilicon layer thickness was about 2000 Angstroms. The transition layer consisted of uniformly varying amounts of silicon and tungsten atoms. The tungsten atomic content decreased from a high value at the $WSi_2$-transition layer interface to a low value at the transition layer-polysilicon interface, while the silicon atomic content increased between these two interfaces. In other words, upon annealing, the silicon atoms near the $WSi_x$-polysilicon interface migrated downward into the upper portion of the polysilicon and/or the tungsten atoms migrated upward into the upper portion of $WSi_x$ layer where they combined with silicon atoms forming stoichiometric $WSi_2$.

While it is not clearly understood why the annealed $WSi_x$/polysilicon sandwich layer exhibits the excellent adhesion noted hereinabove, a plausibility argument, based upon the above extensive analysis, is that the transition layer formed between the $WSi_2$ and polysilicon layers is responsible for the improved adhesion. The gradually varying silicon and tungsten atomic content in the transition layer provides an excellent bond between the silicide and polysilicon.

Thus, there has been described a process of forming $WSi_x$ by which consistently silicon-rich tungsten silicide films can be obtained. The films so formed have excellent adhesion to polysilicon and silicon dioxide. A $WSi_x$/polysilicon sandwich formed in accordance with this invention has a low sheet resistance and is conducive to patterning (into gates, interconnects, etc.) prior to annealing. The resulting etch profile of the sandwich layer is one of near-vertical walls. This process is straightforward and easy to implement by utilizing any off-the-shelf commercially available sputter deposition systems. Due to high sputter deposition rates possible by this process, a high wafer throughput can be achieved.

Reference is now made to FIGS. 1–5 wherein one application of the present invention in the fabrication of integrated circuit devices having $WSi_x$/polysilicon gates and interconnecting conductors is illustrated. Specifically, what is illustrated is a process of forming an NMOS device having a gate electrode and an interconnecting conductor made of a $WSi_x$/polysilicon sandwich layer.

Figure 1:
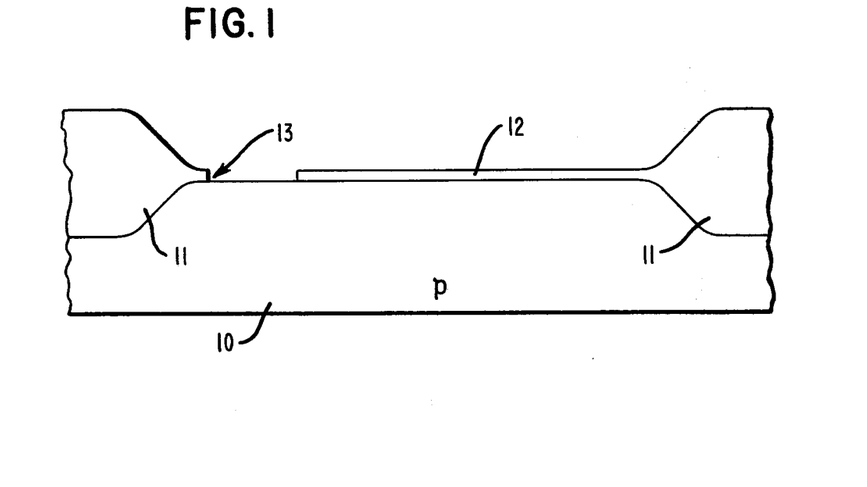
FIGS. 1-5 are flow diagrams illustrating in cross-sectional representation, one example of fabrication of an integrated circuit device in accordance with the present invention.

The starting wafer material is a p-type semiconductor silicon substrate having (100) crystal orientation and bulk resistance in the range (14–21) ohm-cm. The substrate is partitioned in a conventional manner by means of thick silicon dioxide isolation regions. FIG. 1 shows a small portion 10 of the substrate having two thick oxide regions 11. Then, a relatively thin layer of silicon dioxide 12 is grown over the substrate by thermal oxidation in a dry oxygen atmosphere at a temperature of about 1000° C. The thickness of oxide 12 is in the range of 300–1000 Angstroms. The oxide 12 will serve as the gate insulator of the NMOS device.

Next, a depletion and/or enhancement implantation may be accomplished in the active regions depending upon whether a depletion mode or enhancement mode device is to be located in a particular region. This typically consists of a blanket enhancement implant by using boron ions of energy of about (40–100) keV and dose of $(1-10) \times 10^{11}$ ions per square centimeter followed by masking those active areas where enhancement mode devices will be located and accomplishing a depletion implant by using phosphorus ions of energy of about (40–100) keV and a higher dose of about $(1-10) \times 10^{11}$ ions per square centimeter. A higher dose is used for depletion implant to overcome the previous enhancement implant and leave a sufficient amount of p-type ions in the surface area of the active regions where depletion mode devices will be located.

Thereafter, a contact via is etched in oxide layer 12 by conventional photolithography and etching steps exposing the substrate thereunder. This exposed region of the substrate will be utilized for establishing good electrical contact between the substrate surface adjacent n-type source/drain region and the overlying $WSi_x$/polysilicon interconnecting conductor that will be formed in the subsequent stages of the device fabrication. One such contact via, designated by numeral 13, is shown at FIG. 1.

Figure 2:
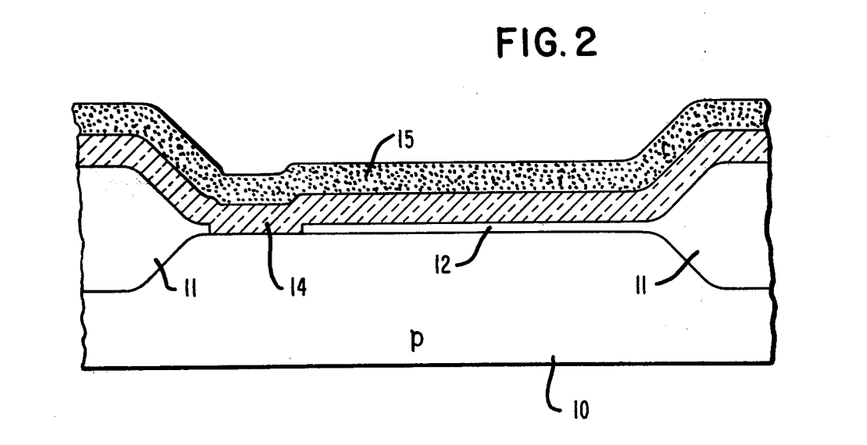

Referring to FIG. 2, the next step in the present fabrication process is deposition of a polysilicon layer 14 by conventional low pressure chemical vapor deposition to a thickness in the range of 1500–3000 Angstroms. Polysilicon 14 is then doped by a conventional technique such as $POCl_3$ deposition and diffusion. As a result of this doping step, a thin layer of phosphorus glass (not shown) will be formed on the polysilicon 14. This glass layer is etched away by using buffered HF to prevent any possible existence of an interstitial oxide layer between the polysilicon layer 14 and the next to be deposited $WSi_x$ layer on the top of polysilicon 14.

Referring to FIG. 2, next a layer 15 of $WSi_x$ is sputter deposited over the polysilicon 14 by cosputtering targets of tungsten disilicide and phosphorus-doped or antimony-doped silicon in the manner described hereinabove under the heading "Sputter Deposition Procedure". The thickness of the silicon-rich tungsten silicide film 15 is in the range of (1500–4000) Angstroms.

Figure 3:
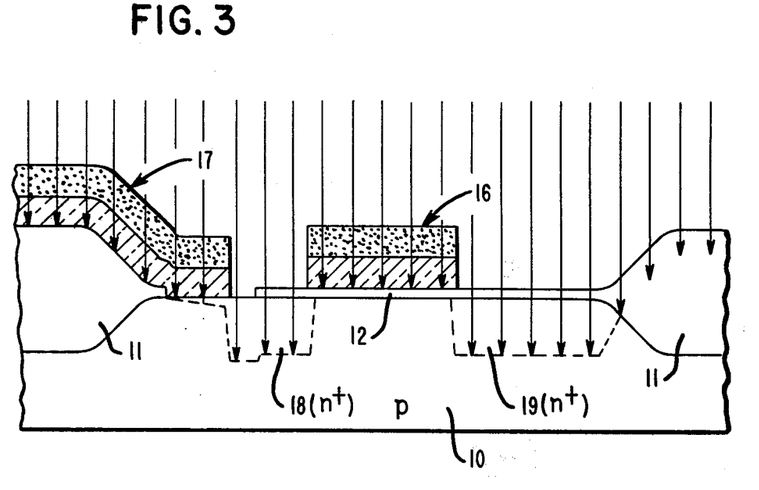

Thereafter, referring to FIG. 3, the $WSi_x$/polysilicon dual layer 14, 15 is defined into gates and interconnecting conductors by conventional photolithography and then etched in a commercially-available planar plasma etching system using an etchant gas mixture of a fluorine-based gas such as sulphur hexafluoride ($SF_6$) and oxygen. A $WSi_x$/polysilicon gate, designated by numeral 16, and interconnecting conductor, designated by numeral 17, formed in this manner is shown in FIG. 3.

The next step in the present fabrication process is forming one or more impurity regions in the substrate 10 in correspondence with the gate 16 and/or the interconnect 17. In one example, as shown in FIG. 3, this may comprise forming a source 18 in correspondence with both the gate 16 and interconnect 17 and a drain 19 in correspondence with the gate 16. One technique of forming the source 18 and drain 19 by ion implantation of the substrate using arsenic ions of energy (60–120) keV and dose $(5-50) \times 10^{15}$ ions per square centimeter. Because of their high energy, the ions penetrate the thin oxide layer 12 overlying portions of substrate 10. The resulting source 18 and drain 19 are self-aligned to the gate 16, which is a much desired feature.

After forming the source 18 and drain 19, the wafer is subjected to an anneal step in a furnace tube at a temperature of about (800–1100)° C. through which a nitrogen flow is maintained to not only repair the damage to the substrate caused by the source 18 and drain 19 implantation but also lower the sheet resistance of the $WSi_x$/polysilicon gate 16 and conductor 17. During this anneal step, care must be exercised to avoid any leakage of oxygen into the furnace tube, thereby preventing any oxidation of the $WSi_x$/polysilicon dual layer.

Figure 4:
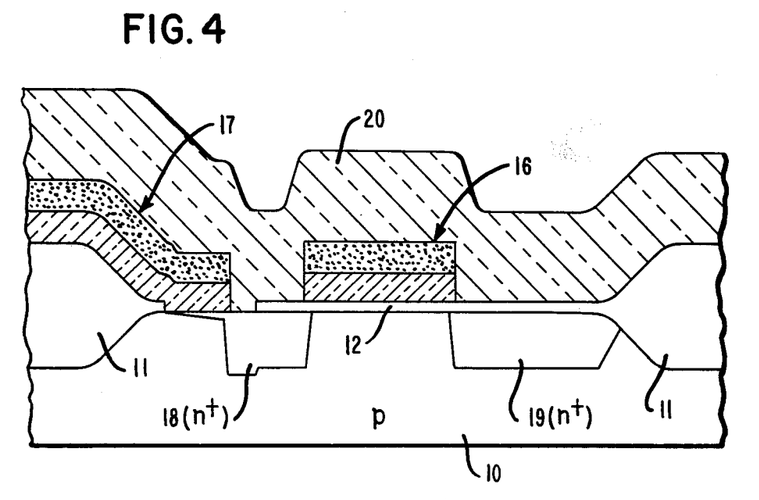

Next, referring to FIG. 4, a low temperature oxide (LTO) layer 20 is formed by conventional CVD techniques at a temperature of about 400° C. The layer 20 is then densified at a high temperature of about 900° C. The layer 20 is typically about 10,000 Angstroms thick and serves to electrically isolate from each other the various $WSi_x$/polysilicon gates and interconnects and additional metal interconnects that will be formed in a subsequent step of this process.

Figure 5:
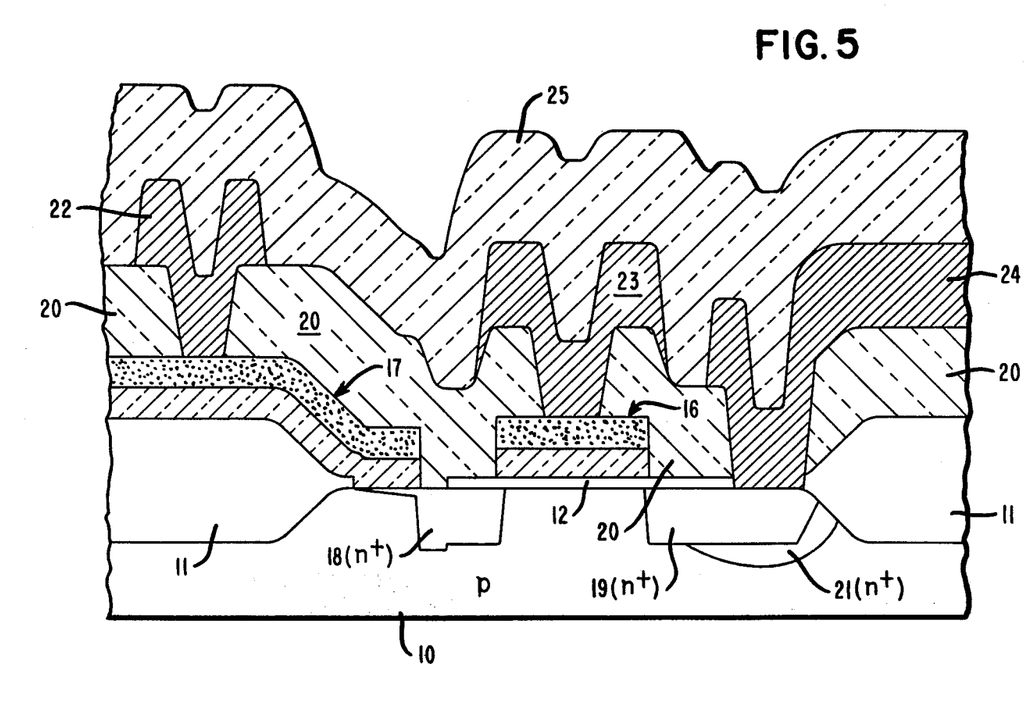

Thereafter, referring to FIG. 5, contact vias are formed in the LTO layer 20 corresponding to the regions where the interconnecting conductor 17, gate electrode 16 and the drain 19 need to be contacted with metal. This is accomplished typically by using buffered HF.

Next, a contact enhancement implantation is accomplished not only to avoid spiking of the metal layer, to be formed in a subsequent step of this fabrication process, through the shallow drain 19 and thereby short circuiting the voltage applied to drain 19 via the substrate 10 and to establish an identical and low contact resistance for the various metal-to-$WSi_x$/polysilicon and metal-to-drain 19 contacts. A low contact resistance will further reduce the device's time delays. A uniform, single contact resistance for all contacts will simplify the integrated circuit design. This implantation may be accomplished by using phosphorus ions of a high energy of about 170 keV and dose $1 \times 10^{14}$ ions per square centimeter. An ion implantation step is chosen instead of the conventional phosphorus (POCl$_3$) deposition and diffusion to avoid any WSi$_x$/polysilicon oxidation which will degrade the device performance. Following the contact enhancement implantation, the structure is subjected to an anneal step using a furnace at a temperature of about 900° C. and maintaining a nitrogen gas flow therethrough. The contact enhancement region under the drain 19 and designated by numeral 21, formed as a result of the above implantation and anneal steps, is shown in FIG. 5.

Referring again to FIG. 5, next, a metal such as aluminum plus 1% silicon is deposited over the entire structure and is patterned into metal interconnects 22, 23 and 24 making electrical contact with the WSi$_x$/polysilicon interconnect 17, the WSi$_x$/polysilicon gate electrode 16 and drain 19, respectively.

After forming the metal contacts, a passivation layer 25, e.g., a thick (12,000 Angstroms thickness) low temperature oxide layer, is formed over the entire structure as shown in FIG. 5.

The NMOS device fabricated using the above novel process has many advantages. The device threshold voltage is within the statistical range of that of an NMOS device having a polysilicon gate. The short channel effect and substrate sensitivity of this device are identical to those of a polysilicon gate device. In addition to preserving these advantageous aspects of silicon gate devices, the WSi$_x$/polysilicon gate electrode has a very low sheet resistance. For example, a device gate electrode having a 2500 Angstroms thick polysilicon layer and a 2500 Angstroms thick WSi$_x$ layer has a sheet resistance of about 4.5 ohms per square.

It is apparent from the foregoing specification, the present invention is susceptible of being embodied with various alterations and modifications which may differ particularly from those that have been described in the preceding specification and description. For this reason, it is to be fully understood that all of the foregoing is intended to be merely illustrative and not to be construed as being restrictive or otherwise limiting of the present invention, excepting as it is set forth and defined in the hereto-appended claims.

What is claimed is:

1. A process of forming silicon-rich metal silicide on a substrate by co-sputtering a target of said metal silicide and a target of doped silicon.

2. The process as recited in claim 1 wherein said metal silicide is tungsten disilicide.

3. The process as recited in claim 1 wherein said substrate is polycrystalline silicon.

4. A process of forming WSi$_x$, where x is in the range of 2-3, on a substrate by cosputtering a target of WSi$_2$ and a target of silicon.

5. A process of forming a low sheet resistance conductor for an integrated circuit on a semiconductor substrate having a layer of polysilicon, said process comprising:
sputter depositing a silicon-rich tungsten silicide layer on the polysilicon layer by co-sputtering a target of tungsten disilicide and a target of silicon; and
simultaneously etching the silicon-rich tungsten silicide and polysilicon dual layer into a conductor.

6. A process of forming a low sheet resistance gate electrode for an integrated circuit on a semiconductor substrate having an insulator layer thereon and a doped polysilicon layer on said insulator, said process comprising:
forming a layer of silicon-rich tungsten silicide on the polysilicon by cosputtering a target of tungsten disilicide and a target of silicon;
simultaneously etching said tungsten silicide and polysilicon dual layer to define source and drain regions in said substrate and a gate electrode corresponding to said source and drain regions; and
simultaneously annealing said source and drain regions and said gate electrode.

7. The process as recited in claim 5 or 6 wherein the silicon-to-tungsten atomic ratio in said silicon-rich tungsten silicide is in the range (2-3).

8. The process as recited in claim 6 further comprising etching said silicide and polysilicon dual layer into interconnecting conductors.

9. The process as in claim 6 wherein said insulator is silicon dioxide.

10. A process of forming a semiconductor device on a semiconductor substrate having, in order, a silicon dioxide layer and a doped polysilicon layer, said process comprising:
forming a layer of silicon-rich tungsten silicide on the polysilicon layer by cosputtering a target of tungsten disilicide and a target of silicon;
simultaneously patterning said silicon-rich tungsten silicide and polysilicon layers into a gate electrode;
forming at least an impurity region in said substrate in correspondence with the gate electrode; and
simultaneously annealing said impurity region and said gate electrode.

11. The process as recited in claim 10 including patterning said silicon-rich tungsten silicide and polysilicon layers into interconnecting conductors.

12. The process as recited in claim 10 wherein the impurity region forming step comprises forming source and drain regions by implanting impurities of a conductivity type opposite to that of the substrate.

13. A process of forming an integrated circuit on a p-type substrate having an active region, said process comprising:
forming a relatively thin layer of silicon dioxide on said active region;
forming a layer of polysilicon over said silicon dioxide; doping the polysilicon with n-type impurities;
forming a layer of silicon-rich tungsten silicide on the polysilicon by cosputtering a target of tungsten disilicide and a target of n-type doped silicon;
simultaneously patterning said silicon-rich silicide and polysilicon dual layer into a gate electrode corresponding to said active region;
forming source and drain regions in said active region by implantation of n-type impurities such that said gate electrode is self-aligned with the source and drain regions; and
simultaneously annealing said gate electrode and the source and drain regions.

14. The process as recited in claim 13 further comprising patterning said silicon-rich silicide and polysilicon dual layer into an interconnecting conductor.

15. The process as recited in claim 14 further comprising following said anneal step:
forming a relatively thick silicon dioxide layer having vias exposing a relatively small portion of the gate electrode, the conductor and source/drain regions; and implanting said exposed portions with a relatively high energy n-type impurities.

16. The process as in claim 15 wherein the thickness of the polysilicon is in the range of (1500–3000) Angstroms and that of the silicon-rich silicide is (1500–4000) Angstroms.

* * * * *